US012627927B2

(12) United States Patent
Tang et al.

(10) Patent No.: US 12,627,927 B2
(45) Date of Patent: May 12, 2026

(54) FAST RESPONSE AUDIO SIGNAL PROCESSING SYSTEM

(71) Applicant: QUALCOMM Incorporated, San Diego, CA (US)

(72) Inventors: Dongyang Tang, San Diego, CA (US); Michael Carfore, Quincy, MA (US)

(73) Assignee: QUALCOMM Incorporated, San Diego, CA (US)

( * ) Notice: Subject to any disclaimer, the term of this patent is extended or adjusted under 35 U.S.C. 154(b) by 241 days.

(21) Appl. No.: 18/617,471

(22) Filed: Mar. 26, 2024

(65) Prior Publication Data

US 2025/0310686 A1 Oct. 2, 2025

(51) Int. Cl.
| | |
|---|---|
| *H04R 3/04* | (2006.01) |
| *H03H 11/04* | (2006.01) |
| *H03K 3/0233* | (2006.01) |

(52) U.S. Cl.
CPC ............... *H04R 3/04* (2013.01); *H03H 11/04* (2013.01); *H03K 3/02337* (2013.01)

(58) Field of Classification Search
CPC ... H04R 1/08; H04R 3/00; H04R 3/04; H04R 19/04; H04R 29/004; H04R 2410/03; H03F 3/181; H03F 3/185; H03G 3/20; H03G 3/22; H03G 3/24; H03H 11/04; H03K 3/02337
See application file for complete search history.

(56) References Cited

U.S. PATENT DOCUMENTS

| | | | | |
|---|---|---|---|---|
| 2014/0334643 A1* | 11/2014 | Pinna | ....................... | H04R 3/04 |
| | | | | 381/107 |
| 2015/0318833 A1* | 11/2015 | Nielsen | .................... | H03G 3/20 |
| | | | | 381/107 |
| 2018/0184200 A1* | 6/2018 | Rocca | ..................... | H03F 3/505 |
| 2025/0175131 A1* | 5/2025 | Chen | ...................... | H03F 3/187 |

* cited by examiner

*Primary Examiner* — Jason R Kurr
(74) *Attorney, Agent, or Firm* — QUALCOMM Incorporated

(57) ABSTRACT

The disclosure pertains to an audio signal processing system that offers low latency without sacrificing various desirable features such as large dynamic operating range and low power consumption. Low latency is achieved by generating a feed-forward signal that is based in part on performing high-pass filtering and threshold crossing detection upon an amplified transducer signal. The feed-forward signal is provided to a controller, which uses the feed-forward signal to produce a feedback signal that controls one or more operating parameters of one or more components of the audio signal processing system. The feedback signal produced in this manner avoids incurring a delay associated with propagating the amplified transducer signal to the controller via an analog-to-digital converter (ADC) for purposes of generating the feedback signal. Generation, and use, of the feed-forward signal also allows the audio amplifier to rapidly adjust to amplitude changes in audio signals received from the transducer.

20 Claims, 6 Drawing Sheets

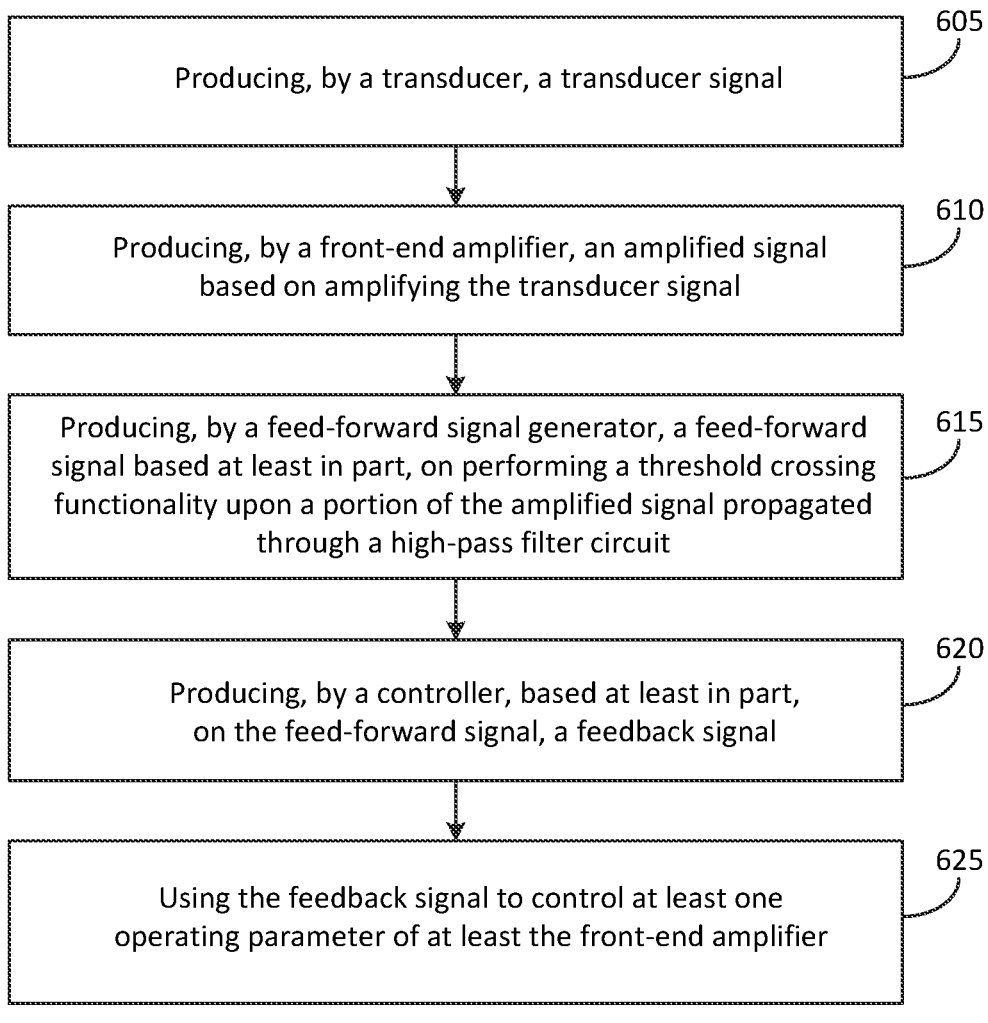

605
Producing, by a transducer, a transducer signal

610
Producing, by a front-end amplifier, an amplified signal
based on amplifying the transducer signal 615
Producing, by a feed-forward signal generator, a feed-forward
signal based at least in part, on performing a threshold crossing
functionality upon a portion of the amplified signal propagated
through a high-pass filter circuit 620
Producing, by a controller, based at least in part,
on the feed-forward signal, a feedback signal 625
Using the feedback signal to control at least one
operating parameter of at least the front-end amplifier

FAST RESPONSE AUDIO SIGNAL PROCESSING SYSTEM

BACKGROUND

1. Field of Disclosure

The present disclosure relates generally to the field of audio signal processing and more specifically to a fast response audio signal processing system.

2. Description of Related Art

An audio signal processing system can be typically used to perform various operations upon audio signals, such as, for example, signal amplification with a desired signal-to-noise ratio, filtering, and digitizing. In some cases, at least some components of the audio signal processing system (such as, for example, a transducer and an audio amplifier) can be housed in an integrated circuit having a small form factor. The audio amplifier may offer various features associated with parameters such as gain, power consumption, bandwidth, and distortion. Some designers may opt to make trade-offs between some of these features. For example, a designer may opt to obtain a better gain-bandwidth product by sacrificing an amount of gain.

BRIEF SUMMARY

An example audio signal processing system can include a transducer, a front-end amplifier, a feed-forward signal generator, and a controller. The front-end amplifier is configured to produce an amplified signal based on amplifying a transducer signal produced by the transducer. The feed-forward signal generator, which is configured to produce a feed-forward signal, can include a high-pass filter circuit and a comparator circuit. The comparator circuit is configured to perform a threshold crossing functionality upon a portion of the amplified signal propagated through the high-pass filter circuit. The controller is configured to receive the feed-forward signal from the feed-forward signal generator and produce a feedback signal that controls at least one operating parameter of at least the front-end amplifier.

An example method of operation of an audio signal processing system can include producing, by a transducer, a transducer signal; producing, by a front-end amplifier, an amplified signal based on amplifying the transducer signal; producing, by a feed-forward signal generator, a feed-forward signal based at least in part, on performing a threshold crossing functionality upon a portion of the amplified signal propagated through a high-pass filter circuit; producing, by a controller, based at least in part, on the feed-forward signal, a feedback signal; and using the feedback signal to control at least one operating parameter of at least the front-end amplifier.

An example audio signal processing system includes means for producing an amplified signal based on amplifying a transducer signal produced by a transducer; means for producing a feed-forward signal based at least in part on performing a threshold crossing functionality upon a portion of the amplified signal propagated through a high-pass filter circuit; means for producing, based at least in part, on the feed-forward signal, a feedback signal; and means for using the feedback signal to control at least one operating parameter of at least one component of the audio signal processing system.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

The detailed description below pertains to a few example embodiments that are illustrated in the accompanying drawings. However, it must be understood that the description is equally relevant to various other variations of the embodiments described herein. Such embodiments may utilize objects and/or components other than those illustrated in the drawings. It must also be understood that like reference numerals used in the various figures indicate similar or identical objects.

FIG. 6 illustrates a flowchart of a method of operation of an audio signal processing system in accordance with an embodiment of the disclosure.

DETAILED DESCRIPTION

Figure 1:
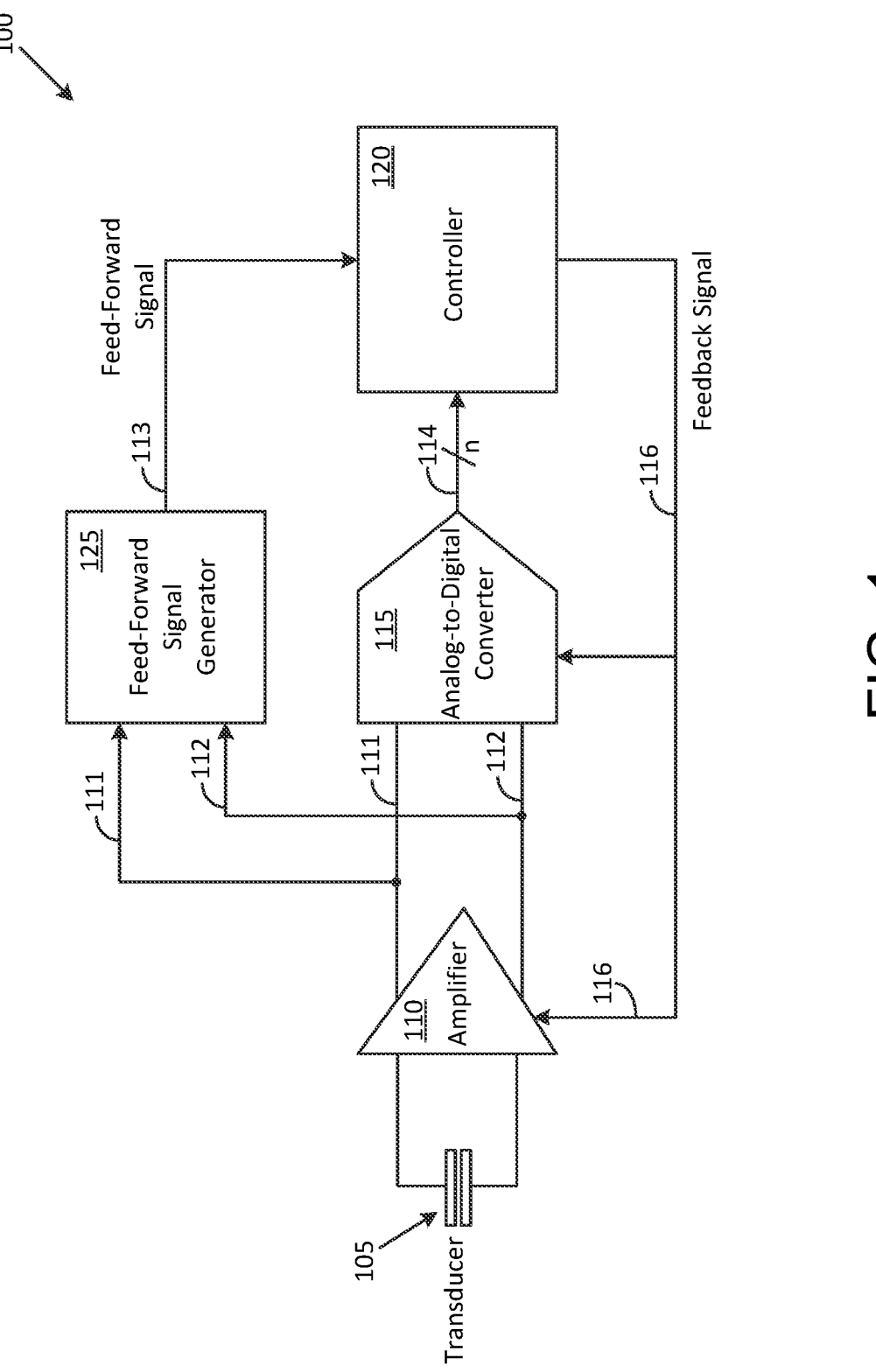
FIG. 1 shows some functional blocks of a fast response audio signal processing system according to an embodiment.

Several illustrative examples will now be described with respect to the accompanying drawings, which form a part hereof. While particular examples, in which one or more aspects of the disclosure may be implemented, are described below, other examples may be used, and various modifications may be made without departing from the scope of the disclosure or the spirit of the appended claims.

Reference throughout this specification to "one example" or "an example" means that a particular feature, structure, or characteristic described in connection with the example is included in at least one example of claimed subject matter. Thus, the appearances of the phrase "in one example" or "an example" in various places throughout this specification are not necessarily all referring to the same example. Furthermore, particular features, structures, or characteristics described herein may be combined in one or more examples.

The word "line" as used herein can refer to any form of electrically conductive elements such as, for example, a metal track on a printed circuit board or a wire. In general, it must be understood (irrespective of being indicated in schematic form or omitted in schematic form) that a line is connected to a component via what can be referred to by various types of labels such as "input node" and "output node." A component such as, for example, a capacitor can include two "terminals" and a transistor can include three or more "terminals." The "terminals" can be provided in various forms such as pins, leads, or surface mount pads, for example. A person of ordinary skill in the art would reasonably interpret such labels and terminologies in the context described herein. In some instances the word "line" is used interchangeably with the word "signal" and such usage must be understood in the context described herein. Furthermore, it must be understood that a description pertaining to a first line of a differential pair of lines is equally pertinent to a second line of the differential pair and must be understood in context. One of ordinary skill in the art will understand that a signal on the second line of the differential pair will have an inverted shape/polarity to the shape/polarity of a corresponding signal on the first line of the differential pair.

It must be understood that in various alternative implementations, the various voltages shown and/or described herein (supply voltages, control voltages, etc.) can have different polarities and/or different amplitudes. In some alternative implementations, a voltage that is illustrated/described herein as a fixed voltage can be replaced by a variable voltage, a selectable voltage, or a programmable voltage. Thus, for example, an illustration/description of a fixed threshold voltage can be replaced with a variable threshold voltage, a selectable threshold voltage, or a programmable threshold voltage. Various transistors shown and/or described herein can be different in various other implementations. Thus, for example, an NFET (N-channel field-effect transistor) shown in an example figure herein can be replaced by a PFET (P-channel field-effect transistor), which can be configured accordingly (biasing, connections, etc.), and vice-versa (PFET replaced by NFET).

It must be understood that a controller that is described herein can be implemented in various ways. For example, the controller can include hardware, firmware, software, and/or combinations thereof for implementing various operations described herein (generation of a feedback signal, for example).

A technical problem that exists in traditional practice pertains to accepting trade-offs between various desirable features in an audio signal processing system that includes an audio amplifier for amplifying signals produced by a transducer. It is desirable for the audio amplifier to have operational features such as low power consumption, large dynamic operating range, low noise, low latency, and low distortion. However, some of these operational features can conflict with each other. For example, configuring the audio signal processing system to desirably operate with low power consumption may conflict with the audio amplifier's capability to respond quickly to accommodate large amplitude transducer signals and/or to suppress transient signal spikes generated by the transducer. The audio amplifier's capability to respond to large amplitude transducer signals and/or to suppress transient signal spikes is generally controlled by a feedback signal that may be applied to the audio amplifier. In a traditional system, such a feedback signal is typically generated by amplifying a transducer signal in the audio amplifier and propagating the amplified transducer signal via an analog-to-digital converter (ADC) to a feedback signal generation circuit. The use of the ADC to convert the amplified transducer signal into a digital format introduces an undesirable delay as a result of use of an ADC clock to perform the analog-to-digital conversion. The ADC delay, which leads to a delay in the generation of the feedback signal by the feedback signal generation circuit, may impose a trade-off in audio amplifier performance such as, for example, sacrificing large dynamic input signal range in order to obtain a desired level of signal fidelity.

A technical solution to address the technical problem described above is provided herein in the form of various embodiments that generally relate to eliminating a trade-off between latency and a large dynamic input signal range. In one embodiment, an audio signal processing system offers low latency without sacrificing various desirable features such as, for example, an ability to accommodate large amplitude changes in transducer signals. Low latency is achieved by using a feedback signal that is generated based on a feed-forward signal. The feed-forward signal is produced without performing an analog-to-digital conversion of the transducer signals. Eliminating the analog-to-digital conversion eliminates the analog-to-digital conversion delay encountered in traditional practice. The feed-forward signal that is generated in accordance with the disclosure, is provided to a controller, which uses the feed-forward signal to produce the feedback signal that can be used to control one or more operating parameters of one or more components of the audio signal processing system.

Particular aspects of the subject matter described herein can be implemented to realize one or more of the following potential advantages. In some examples, an audio signal processing system generates a feedback signal based on a feed-forward signal. The feed-forward signal is generated in a manner that eliminates an analog-to-digital conversion delay encountered in traditional practice. In an example implementation, the feed-forward signal is generated by performing a threshold crossing functionality upon an amplified transducer signal that is propagated through a high-pass filter circuit. The feedback signal can be advantageously used to modify one or more operating parameters of one or more components of the audio signal processing system over a shorter period of time than in a traditional audio signal processing system. In an example implementation, the feedback signal can be used to modify a gain of a front-end amplifier, thereby configuring the front-end amplifier to rapidly accommodate to a large range of signal amplitudes in transducer signals that are to be amplified by the front-end amplifier and to provide signal fidelity by rapidly suppressing amplification of transient noise spikes (if present in the transducer signals).

FIG. 1 shows some example components of an audio signal processing system 100 according to an embodiment. In various implementations, the audio signal processing system 100 can be packaged in various ways and can be included in various devices and systems. For example, in an example embodiment, the audio signal processing system 100 can be provided inside a device such as, for example, inside a smartphone or inside a consumer item such as a television set or music player. Furthermore, some, or all, components of the audio signal processing system 100 can be housed in an integrated circuit, such as, for example, in an Application Specific Integrated Circuit (ASIC) or a hybrid package. The hybrid package can include, for example, a transducer coupled to a surface mounted integrated circuit containing other components of the audio signal processing system 100. In one embodiment, the transducer can be a micro-electro-mechanical system (MEMS) transducer that coverts audio signals into electrical signals. The description provided below with respect to differential signal paths/lines, differential inputs, and differential outputs that are illustrated in FIG. 1 and other figures is equally applicable to other system implementations that may include similar components having single-ended inputs, single-ended outputs, and/or single signal paths/lines.

The example components shown in FIG. 1 include a transducer 105, a front-end amplifier 110, an analog-to-digital converter (ADC) 115, a feed-forward signal generator 125, and a controller 120. The transducer 105, which is coupled to a pair of differential inputs of the front-end amplifier 110, produces audio signals that can, in one embodiment, occupy a bandwidth extending from a few Hz to several KHz. The bandwidth can be different in other embodiments such as, for example, when the transducer 105 is an ultrasonic transducer operating in MHz frequencies.

In an example implementation, the front-end amplifier 110 can be a gain-controllable amplifier that provides a gain that is controllable via a control signal applied to the front-end amplifier 110 via a line 116. The control signal in this example embodiment is a feedback signal produced by the controller 120. The feedback signal may be used to control the gain and/or other operational parameters of the front-end amplifier 110 in various embodiments. Further details pertaining to the feedback signal are provided below.

The front-end amplifier 110 includes a pair of differential outputs that are coupled to the feed-forward signal generator 125 and the ADC 115. More particularly, the differential outputs of the front-end amplifier 110 are coupled with a pair of differential inputs of the feed-forward signal generator 125 and a pair of differential inputs of the ADC 115, via a pair of lines (line 111 and line 112). The ADC 115 in this example is configured to convert an analog signal input into an "n" wide digital output 114, where n≥1.

The feed-forward signal generator 125 operates upon signals having certain characteristics and produces a feed-forward signal that is provided to the controller 120 for generating a feedback signal. Some example characteristics can include large amplitude swings, transient spikes, and/or signal frequencies located outside a desired range of frequencies.

In a traditional approach, the feedback signal may be generated by using the ADC 115 to digitize an analog signal output of the front-end amplifier 110, followed by using the digitized signal to create the feedback signal. However, this traditional approach suffers from a latency issue associated with digitizing the analog signal output of the front-end amplifier 110. The latency can be generally described as a time delay between a time when an analog signal is applied to an input of the ADC 115 and a time when a digital output is produced by the ADC 115. The time delay (latency) can be quantified, for example, based on clock cycles or half-clock cycles of a clock (not shown) used by the ADC 115 for performing the analog-to-digital conversion. A general equation for the latency can be L=k*clock period/2, where "k" can depend upon an architecture of the ADC 115 (flash ADC, delta-sigma ADC, pipeline ADC, successive approximation register (SAR) ADC, etc.). The smaller the value of "k," the smaller the latency. The higher the value of clock frequency (smaller clock period), the smaller the latency.

Using the feed-forward signal produced by the feed-forward signal generator 125 (line 113) to generate the feedback signal, allows the controller 120 to generate the feedback signal without incurring the delay associated with the latency in the ADC 115. More particularly, the feed-forward signal generator 125 operates upon signals in the analog domain and does not include analog-to-digital conversion, thereby eliminating latency associated with the analog-to-digital conversion. Furthermore, the feed-forward signal generator 125 produces the feed-forward signal based on targeted operations that include operations performed upon high frequency signal components of the audio signal output of the front-end amplifier 110. The feed-forward signal produced by the feed-forward signal generator 125 is coupled into the controller 120 via the line 113 for enabling the controller 120 to produce a feedback signal. The feedback signal is coupled into the front-end amplifier 110 (line 116) for modifying one or more operating parameters of the front-end amplifier 110 and can be coupled into other components such as, for example, the ADC 115. Further details pertaining to the feed-forward signal generator 125 are described below.

Figure 2:
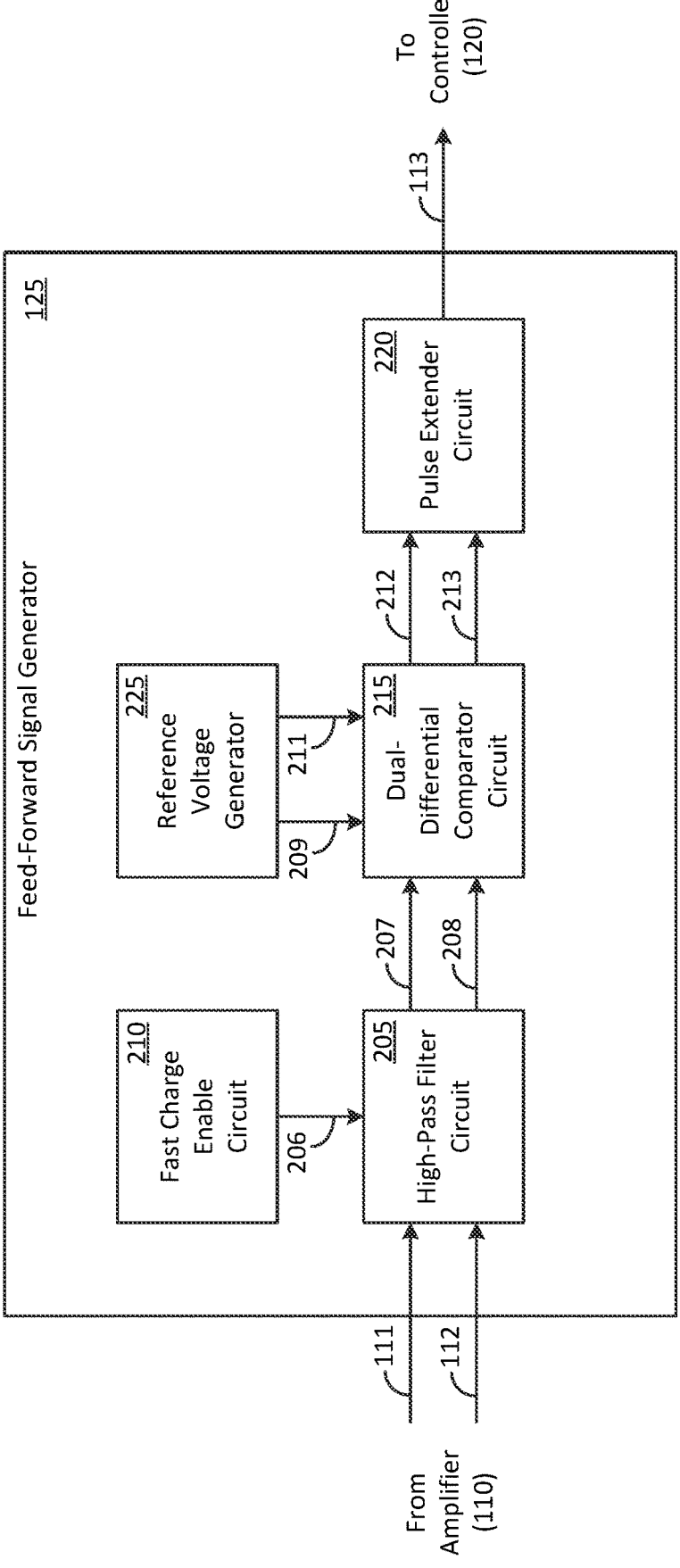
FIG. 2 shows some functional blocks of a feed-forward signal generator that can be a part of the fast response audio signal processing system shown in FIG. 1.

FIG. 2 shows some example components of the feed-forward signal generator 125 shown in functional form. The example components include a high-pass filter circuit 205, a dual-differential comparator circuit 215, a pulse extender circuit 220, a fast charge enable circuit 210, and a reference voltage generator 225. The high-pass filter circuit 205 is coupled with differential output terminals of the front-end amplifier 110 via a differential pair of lines (line 111 and line 112) as shown in FIGS. 1 and 2. The cut-off frequency of the high-pass filter circuit 205 may be selected on a use-case basis of the audio signal processing system 100. For example, in a first use-case, the audio signal processing system 100 can be used for operating upon audio signals generated by a transducer 105 provided in a phone. The audio signals produced by the transducer 105 can desirably range from about 20 Hz to about 20 KHz. However, under some operating conditions, the transducer 105 may generate electrical signals having high frequency components exceeding 20 KHz and/or may generate electrical signals having amplitudes that exceed a threshold amplitude.

The high-pass filter circuit 205 of the feed-forward signal generator 125 selectively propagates such high frequency components into the dual-differential comparator circuit 215 (via line 207 and line 208). The output of the dual-differential comparator circuit 215 is conveyed to a pulse extender circuit 220 (via line 212 and line 213), which produces the feed-forward signal. The feed-forward signal is coupled into the controller 120 (via the line 113) for generation of the feedback signal. The fast charge enable circuit 210, which enables operation of the high-pass filter circuit 205, and the reference voltage generator 225 that provides positive and negative threshold voltages to the dual-differential comparator circuit 215 are described below in more detail.

Figure 3:
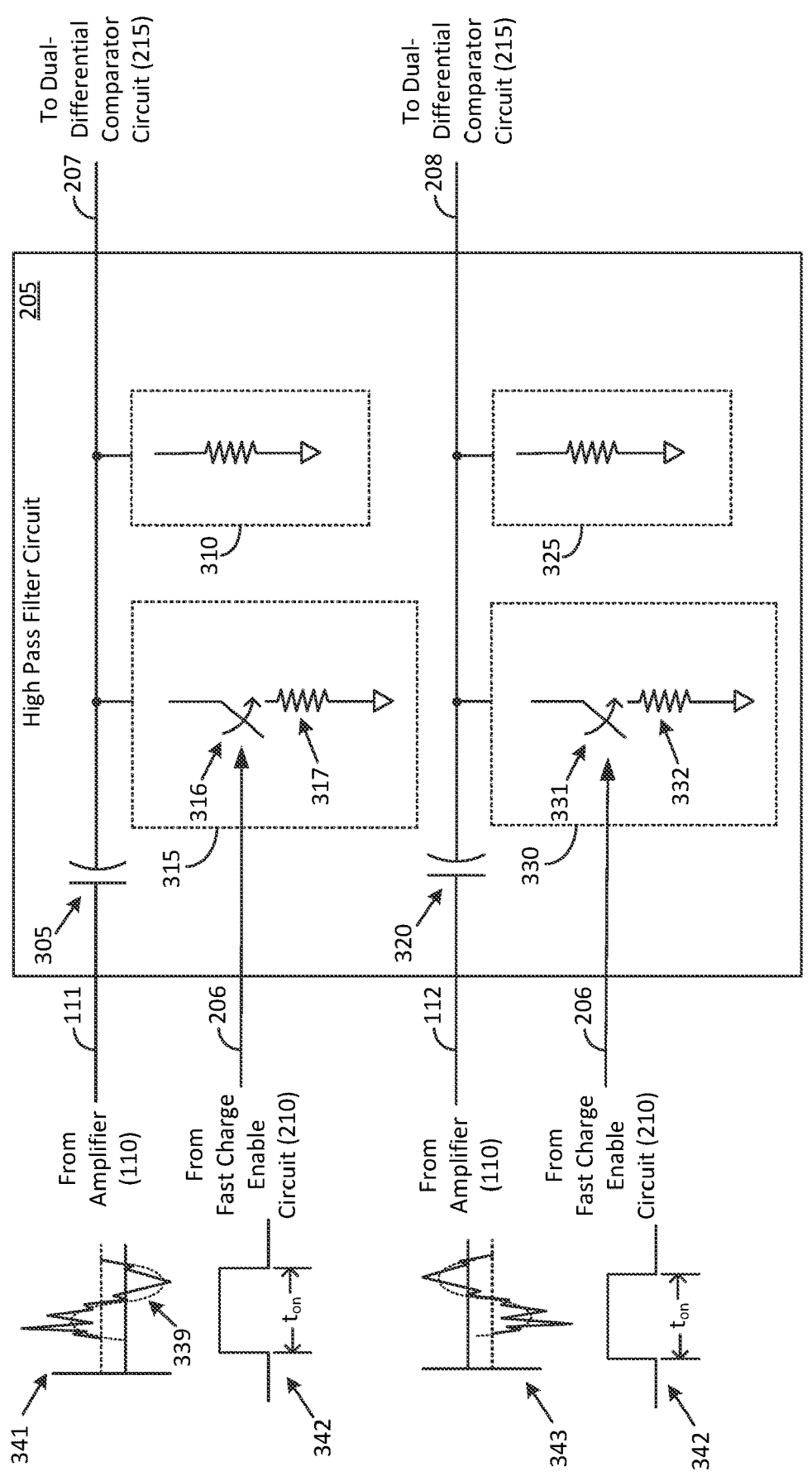
FIG. 3 shows some example components of a high-pass filter circuit that can be a part of the feed-forward signal generator shown in FIG. 2.

FIG. 3 shows a functional representation of the high-pass filter circuit 205 that is a part of the feed-forward signal generator 125 described above. The functional representation is illustrated in the form of various representative components, such as, for example, a first capacitor pre-charging circuit 315 and a first resistive element 310. In various embodiments, the representative components may be replaced with one or more types of components, such as, for example, the first resistive element 310 may be replaced with a FET circuit configured to operate as an active resistor. An example embodiment where an active resistor is used is described below with reference to another figure.

The high-pass filter circuit 205 is arranged to operate upon differential signals coupled into the high-pass filter circuit 205 from the front-end amplifier 110. A positive version of a differential signal that is conveyed via line 111 is coupled into what may be broadly defined as a first RC high-pass filter. A negative version of the differential signal conveyed via line 112 is coupled into what may be broadly defined as a second RC high-pass filter. It must be understood that the labels "positive version" and "negative version" as used herein constitute complementary portions of a differential signal carried over a differential pair of lines.

The first RC high-pass filter is formed of a first capacitor 305 coupled with the first resistive element 310. The first capacitor 305 has a first terminal coupled to an input node 406 of the high-pass filter circuit 205 and a second terminal coupled to an output node 407 of the high-pass filter circuit 205. The first RC high-pass filter blocks any DC component that may be present in the differential signal output of the front-end amplifier 110, thereby preventing any DC offset from propagating through the first RC high-pass filter to the dual-differential comparator circuit 215 via the line 207. However, the first RC high-pass filter allows high-frequency components that may be present in the differential signal output of the front-end amplifier 110 to propagate through to the dual-differential comparator circuit 215 via the line 207. The first RC high-pass filter is configured to operate with what is referred to herein as a charging time constant. The charging time constant, which can be used to define a 3 dB bandwidth of the first RC high-pass filter is described below in more detail.

The high-pass filter circuit 205 further includes the first capacitor pre-charging circuit 315 that is coupled with the first capacitor 305 in the manner shown for pre-charging the first capacitor 305. Pre-charging the first capacitor 305 allows the first RC high-pass filter (i.e., the first capacitor 305 coupled with the first resistive element 310) to respond to fast changes in the differential signal output of the front-end amplifier 110 when producing the feed-forward signal.

In this example embodiment, the first capacitor pre-charging circuit 315 can be broadly described as a resistive component that can be selectively coupled to the first capacitor 305 for pre-charging the first capacitor 305. Pre-charging the first capacitor 305 may be carried out at a pre-charging rate that can be defined by a pre-charging time constant. The pre-charging time constant can be generally defined as a product of the capacitance of the first capacitor 305 and the resistance presented by the first capacitor pre-charging circuit 315 (an RC value). In general, the pre-charging time constant is selected to be smaller than the charging time constant referred to above.

In an example implementation, the pre-charging time constant can be selected based on an amount of time assigned to the first capacitor pre-charging circuit 315 for pre-charging the first capacitor 305. The assigned amount of time may, for example, be included in, and/or defined in, a system specification of the audio signal processing system 100 and/or of a system in which the audio signal processing system 100 is included.

The functionally of the first capacitor pre-charging circuit 315 can be more particularly represented as a switching element 316 coupled in series with a resistor 317. In one implementation, the switching element 316 and the resistor 317 can be two separate components, such as, for example, a switching transistor coupled in series with a discrete resistor, or a switching transistor coupled in series with another transistor that is configured to operate as a resistor (an active resistor). In another implementation, the switching element 316 and the resistor 317 can be integral to a single element such as, for example, a transistor configured to perform a switching function (being placed in a conducting state) while concurrently operating as an active resistor. In yet another implementation, the switching element 316 and the resistor 317 can be provided in the form of a pair of transistors arranged in a configuration that prevents charge leakage out of the first capacitor 305. An example configuration is described below in more detail.

The switching element 316 can be activated by use of a pulse signal 342 that is provided by the fast charge enable circuit 210 via line 206. In this example, a duration over which the switching element 316 remains in an "on" state is defined by a pulse width ($t_{on}$) of the pulse signal 342. When placed in the on state, the resistor 317 is coupled to a terminal of the first capacitor 305. This terminal of the first capacitor 305 is also coupled to a differential signal output (line 207) of the high-pass filter circuit 205. Coupling the resistor 317 to the first capacitor 305 causes a current flow through the first capacitor 305 and the resistor 317 that pre-charges the first capacitor 305 to a voltage level that can be proportional to an amplitude of the output signal 341 from the front-end amplifier 110 present on line 111. The output signal 341 from the front-end amplifier 110 can include low frequency components (such as, for example, a signal component 339 that is shown in a dashed line format) as well as high frequency components (transient signal spikes, for example).

The first resistive element 310 is coupled with the terminal of the first capacitor 305 that is coupled with the differential signal output (line 207) of the high-pass filter circuit 205. The first resistive element 310 operates in conjunction with the first capacitor 305 as the first RC high-pass filter that blocks low frequency components present in the output signal 341 provided by the front-end amplifier 110 via line 111, and allows high frequency components to pass through to line 207 (differential signal output of the high-pass filter circuit 205). In simplistic terms, a corner frequency (−3 dB point) of the first RC high-pass filter may be set based on the formula $fc = \frac{1}{2}\pi RC$ where "R" corresponds to the resistance presented by the first resistive element 310 and "C" corresponds to the capacitance of the first capacitor 305. In an example implementation, the corner frequency can be selected, and/or determined, based on one or more characteristics of the differential signal that is coupled into the feed-forward signal generator 125 (via line 111 and line 112), such as, for example, amplitude variations, waveshape, and/or frequency content. The description above with reference to the first capacitor pre-charging circuit 315 and the first resistive element 310 is equally applicable to a second capacitor pre-charging circuit 330 and a second resistive element 325 respectively. In terms of equivalency, it can be understood that the switching element 331 of the second capacitor pre-charging circuit 330 is equivalent to the switching element 316 of the first capacitor pre-charging circuit 315 and the resistor 332 of the second capacitor pre-charging circuit 330 is equivalent to the resistor 317 of the first capacitor pre-charging circuit 315.

Figure 4:
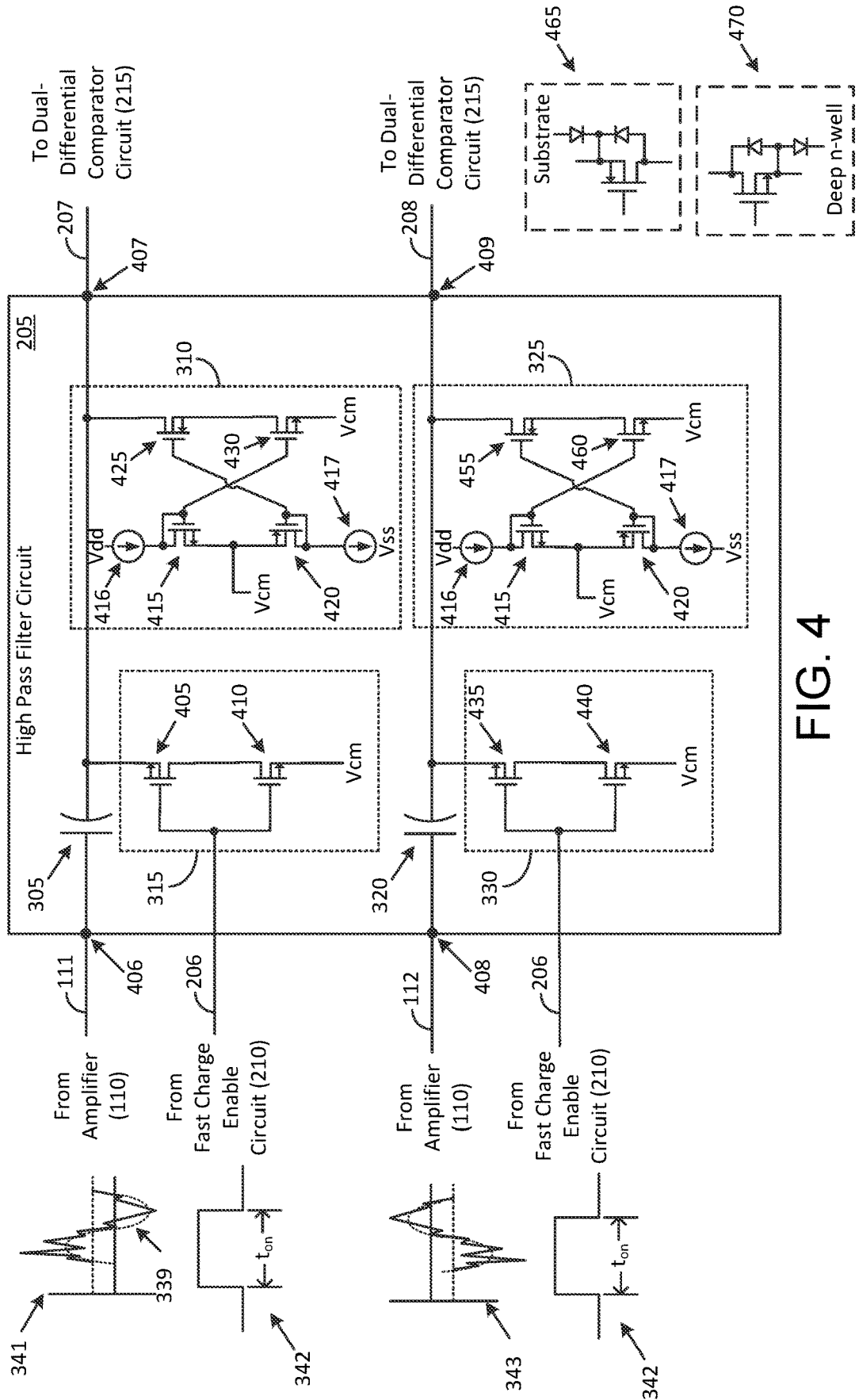
FIG. 4 shows an example implementation of a high-pass filter circuit that can be a part of the feed-forward signal generator shown in FIG. 2.

FIG. 4 illustrates an example implementation of the high-pass filter circuit 205 that is shown in FIG. 3 and described above. In this implementation, the first capacitor pre-charging circuit 315 is formed of two NMOS transistors-NFET 405 and NFET 410 that are connected together in a configuration whereby a first bulk diode structure of the NFET 405 is connected in a back-to-back diode configuration with a second bulk diode structure of the NFET 410. A bulk diode structure as referred to herein pertains to an intrinsic characteristic of certain types of transistors that are fabricated on a substrate of an integrated circuit. The substrate typically includes p-type and n-type semiconductor material arranged in a specific configuration (depending on the transistor being an NMOS FET or a PMOS FET), and the terminals of the transistor, which are fabricated on/in the substrate, may have various form factors, layouts, and inter-terminal spacings. Such a transistor intrinsically provides a diode functionality between two or more terminals of the transistor, and/or between one or more terminals of the transistor and the substrate. An example NFET fabricated in an integrated circuit may include, what is known in the art, as a p-well, a deep n-well, and a p-substrate. The deep n-well can provide the functionality of a bulk diode in conjunction with one or more terminals of the NFET. Such a transistor is referred to herein as a deep n-well NFET.

The back-to-back diode configuration can be implemented by selecting each of the NFET 405 and the NFET 410 to include a deep n-well, and by connecting the NFET 405 with the NFET 410 in the manner shown (drain terminals of the NFET 405 and the NFET 410 connected together). A symbolic representation 470 of a deep-well NFET implemented in an integrated circuit is illustrated in FIG. 4 along with a symbolic representation 465 of a PFET implemented in an integrated circuit. In an example implementation, the NFET 405 and NFET 410 as well as all other NFETs included in the high pass filter circuit 205 are deep n-well FETs.

The pulse signal 342 that is provided by the fast charge enable circuit 210 via line 206 is coupled into the gate terminals of the NFET 405 and the NFET 410 that are coupled together. When the pulse signal 342 is in an active state ($t_{on}$ period), the NFET 405 and NFET 410 are placed in a conducting state that offers a resistance for pre-charging the first capacitor 305 at a pre-charging rate defined by what has been described above, as a pre-charging time constant. The pre-charging time constant is a product of the capacitance of the first capacitor 305 and the resistance of the NFET 405 and the NFET 410 coupled in series.

When the pulse signal 342 is in an inactive state (outside the $t_{on}$ period), the NFET 405 and NFET 410 are placed in a non-conducting state, which is equivalent to the switching element 316 (shown in FIG. 3) being placed in an open condition.

In simplistic terms, the pre-charging rate of the first capacitor 305 can be selected and/or determined based on the RC time constant presented by the first capacitor 305 and the resistance presented by the combination of the NFET 405 and NFET 410 upon application of the pulse signal 342. In one implementation, various characteristics of the pulse signal 342 (time of occurrence, pulse width, polarity, shape, etc.) can be set by the fast charge enable circuit 210 in an independent manner based on various operating conditions of the audio signal processing system 100. In another implementation, various characteristics of the pulse signal 342 (time of occurrence, pulse width, polarity, shape, etc.) can be set by the fast charge enable circuit 210 based on one or more control signals received from the controller 120. The controller 120 may generate the control signal(s) based on various operating conditions of the audio signal processing system 100. It should be understood that the pulse signal 342 can have different shapes and/or various voltage polarities in various implementations such as, for example, different types of edge transitions (slow rise time, slow fall time, etc.).

The NFET 435 and NFET 440, which are connected with each other in a back-to-back diode configuration that is substantially identical to the back-to-back diode configuration described above with reference to the NFET 405 and the NFET 410, combinedly represent the second capacitor pre-charging circuit 330 wherein the switching element 331 is connected in series with the resistor 332. The second RC high-pass filter is formed of a second capacitor 320 coupled with the second resistive element 325. The second capacitor 320 has a first terminal coupled to an input node 408 of the high-pass filter circuit 205 and a second terminal coupled to an output node 409 of the high-pass filter circuit 205. The description provided above with reference to the first capacitor pre-charging circuit 315 and the pulse signal 342 received from the fast charge enable circuit 210 is equally applicable to the second capacitor pre-charging circuit 330.

When activated by use of the pulse signal 342 provided by the fast charge enable circuit 210 via line 206, the NFET 435 and NFET 440 are placed in a conducting state that offers a resistance for pre-charging a second capacitor 320 to a voltage level that can be proportional to an amplitude of the output signal 343 from the front-end amplifier 110 present on line 112. In this case, the pre-charging rate can be defined based on the RC time constant presented by the second capacitor 320 and the resistance of the combination of the NFET 435 and NFET 440. The output signal 343 from the front-end amplifier 110 present on line 112 is complementary in shape to the output signal 341 described above (as is customary for differential signals).

In this example implementation, the first resistive element 310 described above with reference to FIG. 3 is implemented in the form of four FETs, two of which (NFET 415 and PFET 420) are configured to operate as a first biasing circuit for biasing the other two FETs (PFET 425 and NFET 430) that are configured to operate in a resistive mode.

More particularly, PFET 420 is configured to provide a first bias voltage that biases the PFET 425 into a conduction state, and NFET 415 is configured to provide a second bias voltage that biases the NFET 430 into a conduction state. An amplitude of each of the first bias voltage and the second bias voltage is settable via a current source 416 and/or a current source 417. In one embodiment, the current source 416 is a constant current source that provides a current (FET source-drain current) having a fixed amplitude, whereby each of the first bias voltage and the second bias voltage is a preset voltage. In another embodiment, the current source 416 is a variable current source that can be configured to provide various currents having various amplitudes, whereby each of the first bias voltage and the second bias voltage can be variably set. The first bias voltage and the second bias voltage may be variably set based, for example, on a use case of the system 100.

In the illustrated example, the current source 416 is coupled to a voltage Vdd and the current source 417 is coupled to a voltage Vss. In this example arrangement, the source terminals of the NFET 415 and the PFET 420 that are connected with each other are automatically placed at a common mode voltage level (Vcm). In an example implementation, Vss may be 1.8 V, Vdd may be 0V, and Vcm can be approximately 0.9V (median of Vdd and Vss). The source terminal of the NFET 430 is connected to Vcm to enable application, and use, of the second bias voltage, which is produced by the NFET 415 with reference to Vdd and Vcm.

The example implementation of the first resistive element 310 by use of the four FETs includes a gate terminal of the NFET 415 coupled with a gate terminal of the NFET 430 and a gate terminal of the PFET 420 coupled with a gate terminal of the PFET 425. The PFET 425 and the NFET 430 are coupled with each other in an arrangement that presents a large value impedance to positive as well as negative voltage swings that may be present on line 207 as a result of positive and negative voltage swings in the output signal 341 from the front-end amplifier 110. In an example implementation, the large value impedance can be of the order of a Gohm.

More particularly, when the signal on the line 111 swings negative, the PFET 425 is placed in a high conductance state and the NFET 430 is placed in a low conductance state. Conversely, when the signal on the line 111 swings positive, the PFET 425 is placed in a low conductance state and the NFET 430 is placed in a high conductance state. The changes in conductance of the two FETs allows the first resistive element 310 to respond rapidly to changes in the output signal of the front-end amplifier 110 and provide a high-pass filtering action that is more advantageous in comparison to various other traditional high pass filter circuits that use passive resistors in lieu of active resistors, and may be arranged in a different configuration.

The description above with reference to the first capacitor pre-charging circuit 315 comprising NFET 405 and NFET 410 is equally pertinent to the second capacitor pre-charging circuit 330 comprising NFET 435 and NFET 440. Furthermore, the description above with reference to the first resistive element 310 comprising NFET 415, PFET 420, PFET 425, and NFET 430 is equally pertinent to the second resistive element 325 comprising NFET 415, PFET 420, PFET 455, and NFET 460. In the illustrated embodiment, the components that constitute the first biasing circuit (NFET 415 and PFET 420) are used for biasing the PFET 425 and NFET 430 of the first resistive element 310 as well as for biasing the PFET 455 and NFET 460 of the second resistive element 325. In another embodiment, a second biasing circuit that replicates the first biasing circuit but includes an additional pair of FETs can be used. Typically, the additional pair of FETs can be selected to match the first pair of FETs (NFET 415 and PFET 420) for achieving balanced high-pass filtering performance on the positive and negative versions of the differential signal coupled into the high-pass filter circuit 205 (via lines 111 and 112).

Figure 5:
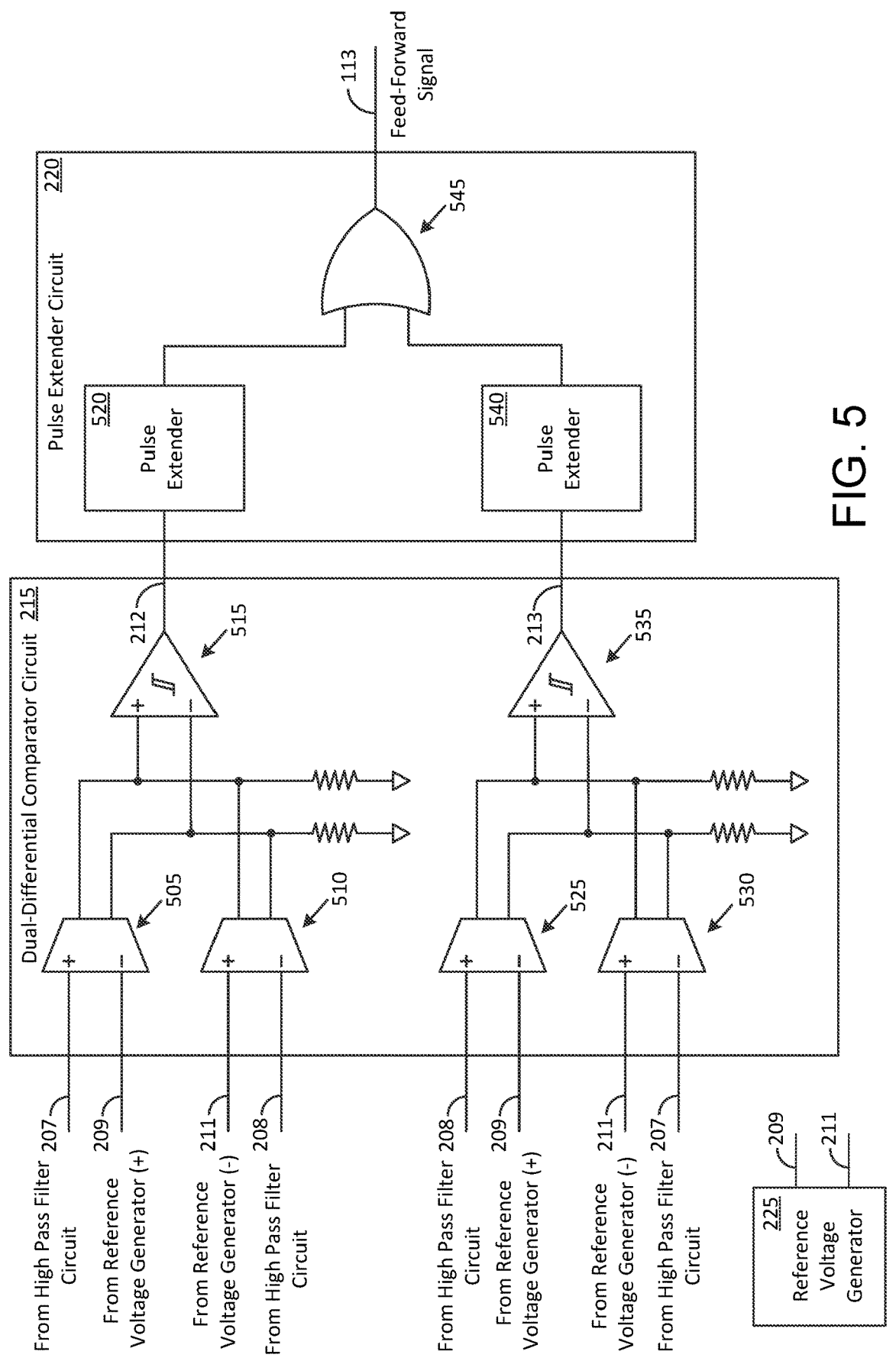
FIG. 5 shows an example implementation of a dual-differential comparator and a pulse extender circuit that can be included in the feed-forward signal generator shown in FIG. 2.

FIG. 5 shows an example implementation of the dual-differential comparator circuit 215 and the pulse extender circuit 220 that can be included in the feed-forward signal generator 125. In terms of a general overview, the dual-differential comparator circuit 215 is configured to produce a differential output signal based on comparing a differential output of the high-pass filter circuit 205 (described above) to a positive voltage threshold and a negative voltage threshold. Voltages corresponding to the positive voltage threshold (line 209) and the negative voltage threshold (line 211) can be generated by the reference voltage generator 225 and coupled into inputs of the dual-differential comparator circuit 215. The differential signal output of the dual-differential comparator circuit 215 is in the form of narrow-width signals. These narrow-width signals are passed through a pulse extender circuit 220 for generating a single-ended feed-forward signal that is coupled into the controller 120 (via the line 113). The interconnectivity between the various functional blocks shown in the various figures can be understood in view of the use of identical reference numerals.

As can be understood from FIG. 4, the differential output of the high-pass filter circuit 205 is provided on line 207 (positive version) and line 208 (negative version). The positive version is coupled into a positive input of a comparator 505 that is a part of the dual-differential comparator circuit 215. A first reference voltage produced by the reference voltage generator 225 is coupled into a negative input of the comparator 505. The first reference voltage, which may be referred to as a first voltage threshold, can be selected to detect any amplitude excursion of the signal on line 207 that exceeds the positive reference voltage. A differential output of the comparator 505 is coupled into a Schmitt trigger comparator 515.

The negative version of the differential output of the high-pass filter circuit 205 is coupled into a positive input of a comparator 510. A second reference voltage produced by the reference voltage generator 225 is coupled into a negative input of the comparator 510. The second reference voltage, which may be referred to as a second voltage threshold, can be selected to detect any amplitude excursion of the signal on line 207 that is lower than the negative reference voltage. A differential output of the comparator 510 is coupled into the Schmitt trigger comparator 515. The output of the Schmitt trigger comparator 515, which may be composed of narrow-width signals, is coupled into a pulse extender 520 for producing wider pulses that are coupled into an OR gate 545. The output of the OR gate 545 is the feed-forward signal that is coupled via line 113 into the controller 120 shown in FIG. 1.

The circuit that is composed of the comparator 525, the comparator 530, the Schmitt trigger comparator 535, and the pulse extender 540, work in a manner similar to that described above with respect to the comparator 505, the comparator 510, the Schmitt trigger comparator 515, and the pulse extender 520. The polarities of the signals and the terminals are as indicated.

Overall, the dual-differential comparator circuit 215 and the pulse extender circuit 220 are configured to detect positive and negative excursions present on the differential output of the high-pass filter circuit 205 that exceed positive and negative thresholds and enable the controller 120 to generate a control signal that can effect a change in one or more properties of the front-end amplifier 110 and/or the ADC 115.

A general procedure that may be applied to designing the high pass filter circuit 205 and the dual-differential comparator circuit 215 can include designing of the reference voltage generator 225 shown in FIG. 2. As indicated above, voltages corresponding to the positive voltage threshold (line 209) and the negative voltage threshold (line 211) generated by the reference voltage generator 225 are coupled into inputs of the dual-differential comparator circuit 215. Designing the reference voltage generator 225 can include specifying a reference voltage and an error tolerance to the reference voltage. An error budget that can be determined based on the reference voltage and the error tolerance can then be shared between the high-pass filter 205 and the dual-differential comparator circuit 215. A portion of the error budget that is applicable to the dual-differential comparator circuit 215 is used for selecting and configuring the various comparators of the dual-differential comparator circuit 215. Another portion of the error budget that is applicable to the high pass filter circuit 205 can be used to determine a corner frequency of the high pass filter circuit 205 and the bias current applicable to the current source 416 and/or current source 417. In an example implementation, the reference voltage may be 10 mV and the error tolerance to the reference voltage may be +/−10%. In this example, the error budget is +/−1 mv (10*+/−0.1=+/−1 mv). The comparators of the dual-differential comparator circuit 215 may then be configured to trigger when the input voltage to the dual-differential comparator circuit 215 exceeds 11 mV (10+1 mv) and to not trigger when the input voltage to the dual-differential comparator circuit 215 is below 9 mV (10-1 mv).

FIG. 6 illustrates a flowchart 600 of a method of operation of an audio signal processing system in accordance with an embodiment of the disclosure. Means for performing the functionality illustrated in one or more of the blocks of the flowchart 600 may be performed by hardware and/or software components of an audio signal processing system such as the audio signal processing system 100 shown in FIG. 1.

At block 605, the functionality can include producing, by a transducer, a transducer signal. In an example embodiment, a transducer signal is produced by the transducer 105 shown in FIG. 1. The transducer 105, which is coupled to a pair of differential inputs of the front-end amplifier 110, produces audio signals that can, in one embodiment, occupy a bandwidth extending from a few Hz to several KHz. The bandwidth can be different in other embodiments such as, for example, when the transducer 105 is an ultrasonic transducer operating in MHz frequencies.

At block 610, the functionality can include producing, by a front-end amplifier, an amplified signal based on amplifying the transducer signal. In an example embodiment, the amplifier 110 shown in FIG. 1 amplifies a transducer signal produced by the transducer 105.

At block 615, the functionality can include producing, by a feed-forward signal generator, a feed-forward signal based at least in part, on performing a threshold crossing functionality upon a portion of the amplified signal propagated through a high-pass filter circuit. In an example embodiment, the feed-forward signal is produced by the feed-forward signal generator 125 based on using the dual-differentia comparator circuit 215 and the pulse extender circuit 220 to perform a threshold crossing functionality upon a portion of the amplified signal propagated through the high-pass filter circuit 205. The portion of the amplified signal, which can be present on line 207 and line 208 is a filtered portion of the amplified signal that is coupled into the high pass filter circuit 205 via line 111 and line 112.

At block 620, the functionality can include producing, by a controller, based at least in part, on the feed-forward signal, a feedback signal. In an example embodiment, the controller 120 can produce the feed-forward signal based, at least in part, on the feed-forward signal provided to the controller 120, by the feed-forward signal generator 125 via the line 113.

At block 625, the functionality can include using the feedback signal to control at least one operating parameter of at least the front-end amplifier. In an example embodiment, a feedback signal produced by the controller 120 is coupled, via line 116, into the amplifier 110 and the ADC 115. The feedback signal may be used, for example, to control the gain and/or other operational parameters of the front-end amplifier 110.

It will be apparent to those skilled in the art that substantial variations may be made in accordance with specific requirements. For example, customized hardware might also be used and/or particular elements might be implemented in hardware, software (including portable software, such as applets, etc.), or both. Further, connection to other computing devices such as network input/output devices may be employed.

With reference to the appended figures, components that can include memory such as, for example, the controller 120, can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media and volatile media. Common forms of computer-readable media include, for example, magnetic and/or optical media, any other physical medium with patterns of holes, a RAM, a programmable ROM (PROM), erasable PROM (EPROM), a FLASH-EPROM, any other memory chip or cartridge, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussion utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the scope of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

In view of this description embodiments may include different combinations of features. Implementation examples are described in the following numbered clauses:

Clause 1. An audio signal processing system including a transducer; a front-end amplifier configured to produce an amplified signal based on amplifying a transducer signal produced by the transducer; a feed-forward signal generator configured to produce a feed-forward signal, the feed-forward signal generator comprising a high-pass filter circuit and a comparator circuit, the comparator circuit configured to perform a threshold crossing functionality upon a portion of the amplified signal propagated through the high-pass filter circuit; and a controller configured to receive the feed-forward signal from the feed-forward signal generator and produce a feedback signal that controls at least one operating parameter of at least the front-end amplifier.

Clause 2. The audio signal processing system of clause 1, further including an analog-to-digital converter configured to perform an analog-to-digital conversion upon the amplified signal produced by the front-end amplifier, the analog-to-digital conversion based at least in part on at least one operating parameter of the analog-to-digital converter being controlled by the feedback signal.

Clause 3. The audio signal processing system of either of clauses 1 or 2, wherein the feed-forward signal generator further includes a reference voltage generator coupled with the comparator circuit, the reference voltage generator configured to produce a positive threshold reference voltage and a negative threshold reference voltage; and a pulse-extender circuit coupled with the comparator circuit, the pulse-extender circuit configured to produce the feed-forward signal based on extending a width of a signal output of the comparator circuit.

Clause 4. The audio signal processing system of any of clauses 1 through 3, wherein the high-pass filter circuit includes a first capacitor having a first terminal and a second terminal, the first terminal coupled to a first input node of the high-pass filter circuit and the second terminal coupled to a first output node of the high-pass filter circuit; a first capacitor pre-charging circuit coupled to the second terminal of the first capacitor, the first capacitor pre-charging circuit configured to pre-charge the first capacitor under control of a first fast charge enable signal; and a first resistive element coupled to the second terminal of the first capacitor. The first resistive element includes a first transistor configured to provide a first bias voltage; a second transistor configured to provide a second bias voltage; a third transistor having a first terminal coupled to the second terminal of the first capacitor; and a fourth transistor coupled with the third transistor, the third transistor configured to operate based on the second bias voltage and the fourth transistor configured to operate based on the first bias voltage.

Clause 5. The audio signal processing system of clause 4, wherein the first transistor is a first NMOS transistor, the second transistor is a first PMOS transistor, the third transistor is a second PMOS transistor, and the fourth transistor is a second NMOS transistor, and wherein the first capacitor pre-charging circuit comprises at least one transistor having a first terminal coupled to the second terminal of the first capacitor, the at least one transistor arranged to be placed in a conduction state under control of the first fast charge enable signal for pre-charging the first capacitor.

Clause 6. The audio signal processing system of clause 5, wherein the at least one transistor having the first terminal coupled to the second terminal of the first capacitor comprises a fifth transistor coupled to a sixth transistor in a back-to-back diode configuration, and wherein an amount of current flowing through the fifth transistor and the sixth transistor is based on the first fast charge enable signal.

Clause 7. The audio signal processing system of clause 5, wherein each of a source terminal of the first NMOS transistor and a source terminal of the first PMOS transistor is coupled to a node that is a common mode voltage.

Clause 8. The audio signal processing system of clause 4, wherein the high-pass filter circuit is a differential high-pass filter circuit further including a second capacitor having a first terminal and a second terminal, the first terminal of the second capacitor coupled to a second input node of the differential high-pass filter circuit and the second terminal of the second capacitor coupled to a second output node of the differential high-pass filter circuit; a second capacitor pre-charging circuit coupled to the second terminal of the second capacitor, the second capacitor pre-charging circuit configured to pre-charge the second capacitor under control of a second fast charge enable signal; and a second resistive element coupled to the second terminal of the second capacitor. The second resistive element includes a fifth transistor configured to provide a third bias voltage; a sixth transistor configured to provide a fourth bias voltage, wherein the fourth bias voltage is lower than the third bias voltage; a seventh transistor having a first terminal coupled to the second terminal of the second capacitor; and an eighth transistor coupled with the seventh transistor, the eighth transistor configured to operate based on the third bias voltage and the seventh transistor configured to operate based on the fourth bias voltage.

Clause 9. The audio signal processing system of clause 8, wherein the fifth transistor is a first NMOS transistor, the sixth transistor is a first PMOS transistor, the seventh transistor is a second PMOS transistor, and the eighth transistor is a second NMOS transistor, and wherein the second capacitor pre-charging circuit comprises at least one transistor having a first terminal coupled to the second terminal of the second capacitor, the at least one transistor arranged to be placed in a conduction state under control of the second fast charge enable signal for pre-charging the second capacitor.

Clause 10. The audio signal processing system of either of clauses 8 or 9, wherein the comparator circuit includes a pair of comparators coupled with a Schmitt trigger comparator, the pair of comparators configured to compare the portion of the amplified signal propagated through the high-pass filter circuit to a positive threshold reference voltage and a negative threshold reference voltage.

Clause 11. A method of operation of an audio signal processing system, the method comprising producing, by a transducer, a transducer signal; producing, by a front-end amplifier, an amplified signal based on amplifying the transducer signal; producing, by a feed-forward signal generator, a feed-forward signal based at least in part, on performing a threshold crossing functionality upon a portion of the amplified signal propagated through a high-pass filter circuit; producing, by a controller, based at least in part, on the feed-forward signal, a feedback signal; and using the feedback signal to control at least one operating parameter of at least the front-end amplifier.

Clause 12. The method of clause 11, wherein performing the threshold crossing functionality comprises using a comparator circuit to compare the portion of the amplified signal propagated through the high-pass filter circuit with a pair of threshold reference voltages.

Clause 13. The method of either of clauses 11 or 12, wherein the high-pass filter circuit comprises a first capacitor and a first resistive element, and wherein the method further comprises configuring the first resistive element to offer a first resistance based on applying a first bias voltage to a first transistor that is a part of the first resistive element.

Clause 14. The method of clause 13, wherein configuring the first resistive element to offer the first resistance is further based on applying a second bias voltage to a second transistor that is a part of the first resistive element, the second transistor coupled with the first transistor.

Clause 15. The method of clause 13, further comprising pre-charging the first capacitor by applying a first fast charge to the first capacitor.

Clause 16. The method of clause 13, wherein performing the threshold crossing functionality comprises using a pair of comparators to compare the portion of the amplified signal propagated through the high-pass filter circuit to a positive threshold reference voltage and a negative threshold reference voltage; and producing narrow-width signals based on a coupling an output of the pair of comparators to a Schmitt trigger comparator.

Clause 17. The method of clause 16, further comprising producing the feed-forward signal based on using a pulse extender circuit to extend a width of the narrow-width signals produced by the Schmitt trigger comparator.

Clause 18. An audio signal processing system comprising means for producing an amplified signal based on amplifying a transducer signal produced by a transducer; means for producing a feed-forward signal based at least in part on performing a threshold crossing functionality upon a portion of the amplified signal propagated through a high-pass filter circuit; means for producing, based at least in part, on the feed-forward signal, a feedback signal; and means for using the feedback signal to control at least one operating parameter of at least one component of the audio signal processing system.

Clause 19. The audio signal processing system of clause 18, wherein means for producing the feed-forward signal comprises means for comparing the portion of the amplified signal propagated through the high-pass filter circuit with a pair of threshold reference voltages.

Clause 20. The audio signal processing system of either of clauses 18 or 19, wherein propagating the amplified signal through the high-pass filter circuit comprises means for coupling the amplified signal into the high-pass filter circuit comprising a capacitor and a resistive element; and means for configuring the resistive element to offer a resistance based on applying a first bias voltage to a first transistor that is a part of the resistive element and a second bias voltage to a second transistor that is a part of the resistive element.

What is claimed is:

1. An audio signal processing system comprising:
a transducer;

a front-end amplifier configured to produce an amplified signal based on amplifying a transducer signal produced by the transducer;

a feed-forward signal generator configured to produce a feed-forward signal, the feed-forward signal generator comprising a high-pass filter circuit and a comparator circuit, the comparator circuit configured to perform a threshold crossing functionality upon a portion of the amplified signal propagated through the high-pass filter circuit; and a controller configured to receive the feed-forward signal from the feed-forward signal generator and produce a feedback signal that controls at least one operating parameter of at least the front-end amplifier.

2. The audio signal processing system of claim 1, further comprising:
an analog-to-digital converter configured to perform an analog-to-digital conversion upon the amplified signal produced by the front-end amplifier, the analog-to-digital conversion based at least in part on at least one operating parameter of the analog-to-digital converter being controlled by the feedback signal.

3. The audio signal processing system of claim 1, wherein the feed-forward signal generator further comprises:
a reference voltage generator coupled with the comparator circuit, the reference voltage generator configured to produce a positive threshold reference voltage and a negative threshold reference voltage; and a pulse-extender circuit coupled with the comparator circuit, the pulse-extender circuit configured to produce the feed-forward signal based on extending a width of a signal output of the comparator circuit.

4. The audio signal processing system of claim 1, wherein the high-pass filter circuit comprises:
a first capacitor having a first terminal and a second terminal, the first terminal coupled to a first input node of the high-pass filter circuit and the second terminal coupled to a first output node of the high-pass filter circuit;

a first capacitor pre-charging circuit coupled to the second terminal of the first capacitor, the first capacitor pre-charging circuit configured to pre-charge the first capacitor under control of a first fast charge enable signal; and a first resistive element coupled to the second terminal of the first capacitor, the first resistive element comprising:
a first transistor configured to provide a first bias voltage;

a second transistor configured to provide a second bias voltage;

a third transistor having a first terminal coupled to the second terminal of the first capacitor; and a fourth transistor coupled with the third transistor, the third transistor configured to operate based on the second bias voltage and the fourth transistor configured to operate based on the first bias voltage.

5. The audio signal processing system of claim 4, wherein the first transistor is a first NMOS transistor, the second transistor is a first PMOS transistor, the third transistor is a second PMOS transistor, and the fourth transistor is a second NMOS transistor, and wherein the first capacitor pre-charging circuit comprises at least one transistor having a first terminal coupled to the second terminal of the first capacitor, the at least one transistor arranged to be placed in a conduction state under control of the first fast charge enable signal for pre-charging the first capacitor.

6. The audio signal processing system of claim 5, wherein the at least one transistor having the first terminal coupled to the second terminal of the first capacitor comprises a fifth transistor coupled to a sixth transistor in a back-to-back diode configuration, and wherein an amount of current flowing through the fifth transistor and the sixth transistor is based on the first fast charge enable signal.

7. The audio signal processing system of claim 5, wherein each of a source terminal of the first NMOS transistor and a source terminal of the first PMOS transistor is coupled to a node that is a common mode voltage.

8. The audio signal processing system of claim 4, wherein the high-pass filter circuit is a differential high-pass filter circuit further comprising:

a second capacitor having a first terminal and a second terminal, the first terminal of the second capacitor coupled to a second input node of the differential high-pass filter circuit and the second terminal of the second capacitor coupled to a second output node of the differential high-pass filter circuit;

a second capacitor pre-charging circuit coupled to the second terminal of the second capacitor, the second capacitor pre-charging circuit configured to pre-charge the second capacitor under control of a second fast charge enable signal; and a second resistive element coupled to the second terminal of the second capacitor, the second resistive element comprising:

a fifth transistor configured to provide a third bias voltage;

a sixth transistor configured to provide a fourth bias voltage, wherein the fourth bias voltage is lower than the third bias voltage; and a seventh transistor having a first terminal coupled to the second terminal of the second capacitor; and an eighth transistor coupled with the seventh transistor, the eighth transistor configured to operate based on the third bias voltage and the seventh transistor configured to operate based on the fourth bias voltage.

9. The audio signal processing system of claim 8, wherein the fifth transistor is a first NMOS transistor, the sixth transistor is a first PMOS transistor, the seventh transistor is a second PMOS transistor, and the eighth transistor is a second NMOS transistor, and wherein the second capacitor pre-charging circuit comprises at least one transistor having a first terminal coupled to the second terminal of the second capacitor, the at least one transistor arranged to be placed in a conduction state under control of the second fast charge enable signal for pre-charging the second capacitor.

10. The audio signal processing system of claim 8, wherein the comparator circuit comprises:

a pair of comparators coupled with a Schmitt trigger comparator, the pair of comparators configured to compare the portion of the amplified signal propagated through the high-pass filter circuit to a positive threshold reference voltage and a negative threshold reference voltage.

11. A method of operation of an audio signal processing system, comprising:

producing, by a transducer, a transducer signal;

producing, by a front-end amplifier, an amplified signal based on amplifying the transducer signal;

producing, by a feed-forward signal generator, a feed-forward signal based at least in part, on performing a threshold crossing functionality upon a portion of the amplified signal propagated through a high-pass filter circuit;

producing, by a controller, based at least in part, on the feed-forward signal, a feedback signal; and using the feedback signal to control at least one operating parameter of at least the front-end amplifier.

12. The method of claim 11, wherein performing the threshold crossing functionality comprises:

using a comparator circuit to compare the portion of the amplified signal propagated through the high-pass filter circuit with a pair of threshold reference voltages.

13. The method of claim 11, wherein the high-pass filter circuit comprises a first capacitor and a first resistive element, and wherein the method further comprises:

configuring the first resistive element to offer a first resistance based on applying a first bias voltage to a first transistor that is a part of the first resistive element.

14. The method of claim 13, wherein configuring the first resistive element to offer the first resistance is further based on applying a second bias voltage to a second transistor that is a part of the first resistive element, the second transistor coupled with the first transistor.

15. The method of claim 13, further comprising:

pre-charging the first capacitor by applying a first fast charge to the first capacitor.

16. The method of claim 13, wherein performing the threshold crossing functionality comprises:

using a pair of comparators to compare the portion of the amplified signal propagated through the high-pass filter circuit to a positive threshold reference voltage and a negative threshold reference voltage; and producing narrow-width signals based on a coupling an output of the pair of comparators to a Schmitt trigger comparator.

17. The method of claim 16, further comprising:

producing the feed-forward signal based on using a pulse extender circuit to extend a width of the narrow-width signals produced by the Schmitt trigger comparator.

18. An audio signal processing system, comprising:

means for producing an amplified signal based on amplifying a transducer signal produced by a transducer;

means for producing a feed-forward signal based at least in part on performing a threshold crossing functionality upon a portion of the amplified signal propagated through a high-pass filter circuit;

means for producing, based at least in part, on the feed-forward signal, a feedback signal; and means for using the feedback signal to control at least one operating parameter of at least one component of the audio signal processing system.

19. The audio signal processing system of claim 18, wherein means for producing the feed-forward signal comprises:

means for comparing the portion of the amplified signal propagated through the high-pass filter circuit with a pair of threshold reference voltages.

20. The audio signal processing system of claim 19, wherein propagating the amplified signal through the high-pass filter circuit comprises:

means for coupling the amplified signal into the high-pass filter circuit, the high-pass filter circuit comprising a capacitor and a resistive element; and means for configuring the resistive element to offer a resistance based on applying a first bias voltage to a first transistor that is a part of the resistive element and a second bias voltage to a second transistor that is a part of the resistive element.

* * * * *